(12) United States Patent
Amin et al.

(10) Patent No.: US 7,671,436 B2
(45) Date of Patent: Mar. 2, 2010

(54) ELECTRONIC PACKAGES

(75) Inventors: Ahmed Nur Amin, Fairfax, VA (US); Mark Adam Bachman, Sinking Spring, PA (US); David Lee Crouthamel, Bethlehem, PA (US); John William Osenbach, Kutztown, PA (US); Brian Thomas Vaccaro, Mertztown, PA (US)

(73) Assignee: Agere Systems Inc., Allentown, PA (US)

( * ) Notice: Subject to any disclaimer, the term of this patent is extended or adjusted under 35 U.S.C. 154(b) by 130 days.

(21) Appl. No.: 12/151,108

(22) Filed: May 2, 2008

(65) Prior Publication Data

US 2009/0273078 A1    Nov. 5, 2009

(51) Int. Cl.
*H01L 31/00* (2006.01)

(52) U.S. Cl. .................. 257/459; 257/779; 257/E23.02

(58) Field of Classification Search .................. 257/457, 257/459, 778, 779, 737, 738, E23.02
See application file for complete search history.

(56) References Cited

U.S. PATENT DOCUMENTS

| | | | | |
|---|---|---|---|---|
| 6,288,905 B1 * | 9/2001 | Chung | .......................... | 361/771 |
| 2009/0212428 A1 * | 8/2009 | Yang et al. | .................. | 257/738 |

* cited by examiner

*Primary Examiner*—Thien F Tran
(74) *Attorney, Agent, or Firm*—Mendelsohn, Drucker & Asociates, P.C.; Steve Mendelsohn

(57) ABSTRACT

Assemblies involving integrated circuit dies (e.g. packaged integrated circuits) and packaged dies electrically connected to circuit boards at times mechanically fail at conducting pads used for electrical interconnection. Such failure is mitigated by underlying appropriate pads with a compliant region having specific characteristics.

21 Claims, 2 Drawing Sheets

ELECTRONIC PACKAGES

TECHNICAL FIELD

This invention relates to electronic devices and in particular packaging of electronic devices such as integrated circuits.

BACKGROUND OF THE INVENTION

For integrated circuits i.e., circuits having multiple active elements formed on a silicon substrate, the formation of the circuits on the silicon substrate is only part of the fabrication procedure. The silicon substrate with its subsequent layers added during device formation generally has outermost surface regions—pads—of high electrical conductivity, i.e. conductivity greater than 0.02 $(\mu\text{ohm-cm})^{-1}$ employed for electrical communication with the integrated circuit. Electrical connection to these pads and the protection of the silicon substrate with its added layers i.e. in totality, the die, is denominated in the trade as packaging.

A variety of methods have been used to connect the die to electronic circuitry external to the die such as by forming an interface between a die package and an external substrate or forming an interface directly to a circuit board e.g. printed circuit board. The two most commonly used interfaces from die to external substrate or circuit board are wirebonding and flip chip solder bumps. Wirebonding uses a wire, e.g. a gold wire, connection between the die pad and the external substrate pad or circuit board pad. Flip chip solder bumps connect the die pad to the external substrate pad or the circuit board pad via solder e.g. metal alloys such as Sn—Pb, Sn—Ag—Cu or Sn—Ag. These conducting masses are typically spherical in shape and are generally denominated solder bumps. (Although the connecting entities are termed solder bumps, the material of these bumps need not be solder but are formed from material that is electrically conducting. Similarly the shape of the entities need not be spherical, even though solder bumps are generally spherical in nature, more precisely truncated spheroids, since such shape is thermodynamically preferred. Other materials have other preferred stable states. For example, copper is more readily manufacturable in a cylindrical shape.) The connecting bumps, in the context of this disclosure generically referred to as solder bumps, are employed to produce an electrical pathway to other entities.

In a common approach, the desired electrical connection is produced by physically abutting the solder bumps of the integrated circuit die with a corresponding array of electrically conducting bodies (also referred to for purpose of this disclosure as pads) formed on a body external to the die e.g. an external substrate and/or a rigid or flexible circuit board. Generally, the array on the integrated circuit die and the mating array on the external body are formed in a geometric grid pattern. However, the geometry of the array is not critical and any configuration is considered for purposes of this disclosure as an array. Additionally, although the conducting array of the external substrate generally has a mating conducting region corresponding to each bump of the die such one to one correspondence is not required. The correspondence is chosen to effectuate the electrical connections necessary to produce the desired electrical circuit. The array of bumps formed from solder is mated with the pad array of the external body. This interconnection provides both an adequate mechanical and electrical connection. A typical assembly sequence for connecting a solder bumped die to a rigid or flexible substrate includes: 1) abutting the solder bumps with the substrate using flux as an intermediary, and 2) heating the assembly above the liquidus temperature of the solder. For example, heating is accomplished by employing temperatures in the range 217 to 260 degrees C., for commonly used lead-free solders typically containing Sn, Cu, and Ag and 183 to 225 degrees C. for eutectic Pb—Sn solders. Accordingly, a metallurgical joint is created between the solder and the die pads as well as between the solder and the external body pads. For improved mechanical and environmental stability, the joint is typically reinforced with a polymeric material (denominated an underfill) between the die and the substrate.

Nevertheless, despite these precautions, significant mechanical forces that cause deformation of the assembly are possible. Such forces are a consequence of the variety of materials constituting the assembly components and their corresponding differing thermo-mechanical properties, e.g. modulus and coefficient of thermal expansion. Additionally, differences in die size, substrate size, bump dimensions, material thicknesses only augment the difficulty in avoiding assembly deformation. (Although it is possible that there is no difference between the die and the external substrate in either stiffness and/or coefficient of thermal expansion, such circumstances are coincidental and quite unusual.) Further, even if the mechanical forces of a die/external body combination are tolerated at one operating temperature, mechanical failure of the combination is still a real possibility due to ambient temperature changes associated with transport or operation.

Mechanical distortion and/or failure, i.e. delamination or cracking at a material layer interface or cohesive failure within a material layer, is a real concern and often is the cause of, or contributing factor to, failure of an electronic component. Since the materials used in the die/external body assembly are generally dictated by a variety of electrical and mechanical demands associated with other problems there has been little flexibility in expedients used to maintain mechanical stability of the die/external body combination. In addition commercial considerations are driving the technology towards use of thinner material layers that, in turn, allow increased bending and thus increased mechanical stresses and strains experienced by the die/external body structure. An approach that mitigates the risk for failure due to thermomechanically induced loads for a reasonable spectrum of operating conditions and die/external body configurations would be quite desirable.

SUMMARY OF THE INVENTION

Substantial flexibility in coping with mechanical forces present in die/external body combinations is achieved by using a compliant material of suitable properties. Such compliant material should be appropriately positioned between 1) the pads of the external body to which the solder bump is connected and the material layers of the substrate or 2) the pads of the die and material layers of the die. The properties of the compliant material are carefully chosen to yield the desired flexibility. In particular, the material should have a thickness greater than or equal to 10 µm; should have a modulus less than 250 MPa; and an elongation to failure greater than or equal to 75 percent and more preferably greater than or equal to 100 percent. (Thickness in the context of this invention is the average distance between major surfaces of a region measured in a direction normal to such major surface of the region closest to the pads. The modulus is defined by the slope of the stress/strain curve in a tensile load test as described in *Mechanical Properties of Solid Polymers*, I. M. Ward, John Wiley & Sons, New York, 1983, p. 252 and is a measure of material rigidity. The elongation to failure is the strain at which a material region breaks and is measured by a tensile load test as described in Ward supra p. 359.

Not only should the properties of the compliant material be in the ranges specified, but this material should substantially decouple the critical pads of the external body and/or of the die from the adjacent material. A pad is considered critical in the context of this invention if it is one millimeter or more from the neutral point of the structure adjacent to the pad before the joint is formed. (The neutral point of a body is considered the centroid of the major surface of the body subsuming the pad. The centroid of a region is defined in Mechanics of Materials by Ferdinand P. Beer and E. Russell Johnston Jr., McGraw-Hill, N.Y., 1992, Appendix A page 690 et seq.) For a metallic region, (i.e. the pads on the external body) to be decoupled a sufficient number of the critical regions (pads on the external body or, alternatively, on the die) should have adjacent compliant regions such that 75 percent of the total area of the critical regions have underlying compliant regions.

By decoupling the critical regions of the die/external body assembly with a compliant material of suitable properties the combined die/external body assembly is able to resist substantially greater forces than in the absence of such expedient.

Thus a greater flexibility in the use of materials and configurations is possible since a greater range of generated forces without failure is tolerated.

DETAILED DESCRIPTION

Figure 1:
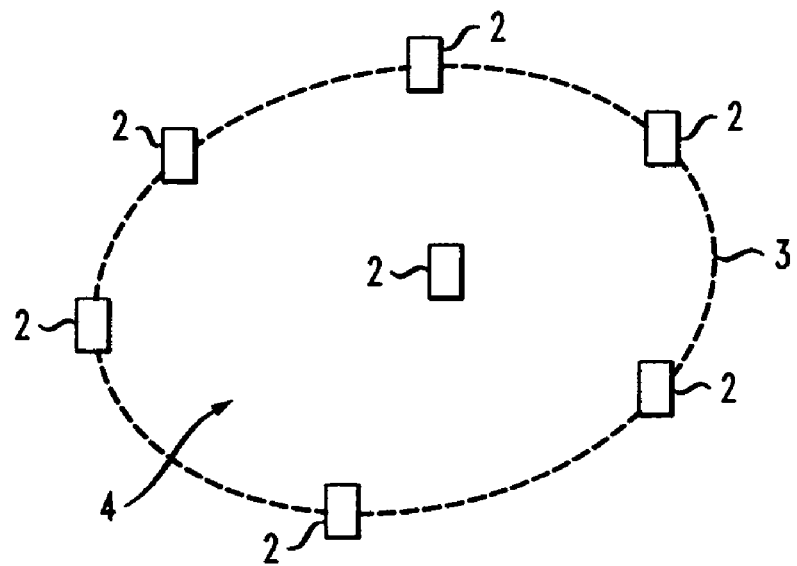
FIG. 1 is illustrative of a concept associated with the invention.

As previously discussed, the invention, in one aspect, involves an integrated circuit die/external body combination where the die and/or the external body includes a compliant region of suitable composition that decouples critical regions. The invention further subsumes, in another aspect, a component of such combination—either the die or the external body—that has a compliant region of suitable composition that decouples critical regions of the component. (In the context of this invention the external body is considered the complimentary component for the die, and similarly the die is considered the complimentary component for the external body.) In another aspect a combination that is mechanically robust is formed by inducing intimate contact between one such component that has an appropriate compliant region and the complimentary component which either has, or which does not have, a compliant region.

Suitable compliant material regions to yield the advantageous properties of the invention should have specific properties. In particular the region should have an average thickness of at least 10 μm. Thicknesses less than 10 μm do not generally provide sufficient decoupling of the critical parts. Although thicknesses well above 10 μm are employable, it is generally inconvenient and uneconomic to use regions with average thicknesses greater than 100 μm. A variety of procedures are available to form a compliant region of suitable average thickness. For example such region is produced by lamination of a compliant material onto the substrate and then laminating or plating the electrical connection, i.e. pads on the compliant material. The desired thickness is achieved by adjusting the procedure parameters such as initial film thickness, lamination temperature and pressure. A controlled sample is employed to determine suitable parameters that yield a desired average thickness.

The composition forming the compliant material regions should have a modulus equal to or less than 250 MPa, more advantageously less than 200 MPa, most advantageously less than 100 MPa. Compositions having a modulus above 250 MPa generally do not provide the required decoupling of the differential mechanical strains and stresses that are imposed on the structure such that unacceptable bending stresses and shear stresses are transmittable to the other parts of the device. Additionally the composition forming the compliant material region should have an elongation to failure greater than or equal to 75 percent, advantageously greater than 100 percent, most advantageously greater than 500 percent. Compositions with elongation to failure less than 75% are not typically desirable since they tend to allow cohesive failure within the compliant material itself.

Generally organic elastomers such as silicones and rubbers are useful for producing a compliant region with suitable properties. Although these compositions are useful, the invention nevertheless also encompasses any material satisfying the previously discussed criteria for elongation to failure and modulus.

The compliant material should be positioned to underlie critical pads of the external body and/or critical contact pads of the die (collectively critical structures) to decouple such structures. A critical structure is one that is at least 1 mm from the neutral point of an entity, either die or external body, on which the structure is located. The neutral point, in turn, is the centroid of the surface layer whose outer perimeter is defined by the surface upon which the critical structures directly rest. (That is, the surface layer for purposes of ascertaining the centroid is defined by considering either 1) the underlying surface of each contact pad of the die, or 2) for external body pads the underlying surface of each body pad, and defining the surface layer as the two dimensional region closing and joining such underlying surfaces. (Underlying in this context means the side of the pad that is not open to the ambient before bonding procedures such as soldering.) The centroid of this surface is as defined in Beer and Johnston Jr. supra. For pedagogic purposes it is possible to visualize the centroid as the point on which the surface would balance if it were of constant density. To illustrate, the concept of the centroid is as shown in FIG. 1, where the critical pads, 2, define the centroid surface through the expedient of forming a contiguous perimeter, 3, around such pads and including the internal surface, 4.

The critical features of a die and/or of an external body upon which such die is to be mounted should be decoupled from the bulk of the die or external body respectively. For the critical features in the die and/or in the external body to be decoupled the complaint material should underlie a sufficient number of such critical features such that 75%, more advantageously 85%, most advantageously 95% of the total area of such features of the die and/or of the external body is underlain.

Figure 2:
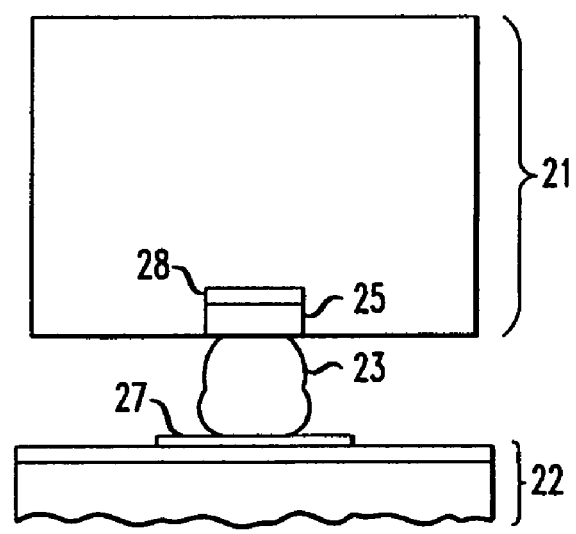
FIGS. 2 through 4 are illustrative of embodiments of the invention.

In one embodiment the combined structure in cross-section through a solder bump is shown in FIG. 2. Thus the die, 21, and the external body, 22, are joined at solder bumps, 23. Bump, 23, of die, 21, is in contact with the die pad 25 and similarly with the body pad 27 of body 22. Compliant region, 28, underlies pad 25. In another embodiment, shown in FIG. 3, compliant region, 29, underlies pad, 27, and compliant region 28 is not employed. In a third embodiment, shown in FIG. 4, both compliant region 28 and 29 are used. Connection between the die and the external body is made for example by reflowing the solder bumps of the die to the external body pad. When the die bumps are connected to the external body pads the desired electrical/mechanical connection is established. In one embodiment the bumps while in appropriate contact are heated using a commercial multi-zone reflow oven to a temperature for typical solders in the range 183 to 260 degrees C. for a time period in the range 30 to 180 seconds. Other approaches are possible for making appropriate electrical contact. For example copper to copper bonding is possible such that copper bumps or pillars are brought in contact with copper pads and heated in an inert atmosphere to temperatures above 300 degrees C. for times longer than 5 minutes.

The conventional packaging of dies is well known and is fully discussed in Modern Solder Technologies for Competitive Electronics Manufacturing, J. S. Hwang, McGraw Hill, 1996. The fabrication of external bodies such as flexible or rigid circuit boards, e.g. printed circuit boards, using for example aluminum or copper pads on a polyimide substrate is also well known and is described in Hwang, supra. Typically the pads in such printed circuit boards have thickness in the range 5 to 30 µm and are from 50 to 300 µm wide. Pads in the silicon die generally comprise aluminum or copper, are 0.5 to 3 µm thick, and have areas in the range 1000 to 20,000 µm² with major dimensions in the range 32 to 150 µm.

The following example is illustrative of configurations and processing parameters involved in aspects of the invention.

EXAMPLE

Figure 3:
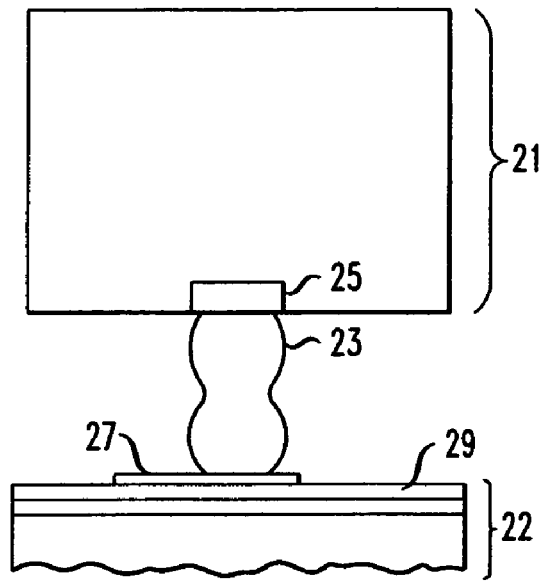
Figure 4:
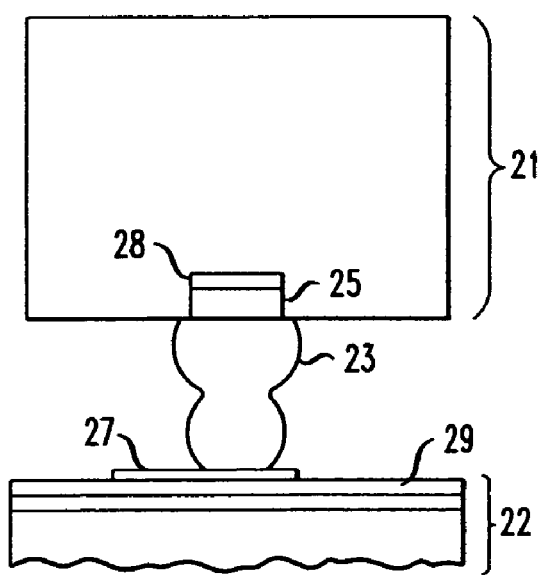

An assembly of general structure as illustrated in FIG. 3 was fabricated. The assembly included an integrated circuit having bumps in direct contact with a stiff, non-compliant inorganic silicon nitride or silicon oxide layer. The bumps on the silicon integrated circuit were attached to the silicon die of the integrated circuit using standard bump processing including under bump metallization (typically referred to as UBM) that was accomplished by vapor deposition onto the external surface of the die—a surface constituting silicon dioxide and metal circuit pads. The UBM layer is composed of successively deposited layers i.e. 400 nm of vapor deposited aluminum followed by 400 nm of vapor deposited nickel followed by 800 nanometers of copper. (This composite structure acts as the adhesion layer between the die and the solder bump.) The UBM is then patterned using standard photolithography and wet chemical etching. That is, resist material is patterned by lithography to be positioned on the blanket metallization only above the pads. The remaining, exposed portions of the metallization were removed by standard etching. Following UBM deposition and patterning, a 95.5 weight percent tin, 4 weight percent silver and 5 weight percent copper, solder alloy was screen printed onto the defined UBM pads and the solder was reflowed. The reflow process used a peak temperature of 245 degrees C. plus or minus 5 degrees C. The reflow profile was set in accordance with JEDEC specification J-STD-020B. Subsequently the die with its solder bumps was positioned so that these bumps contacted the appropriate substrate pads. For proper wetting the solder bumps were first coated with a standard flux sold by Kester Corporation. (The flux was used to promote removal of surface oxides possibly present on the bump or the substrate pad, thus facilitating wetting. In addition, the flux was used to promote mechanical attachment of the bumps to the substrate prior to a metallurgical bond formation that occurs during and after reflow.) The substrate was fabricated such that all of the pads overlay a flexible, compliant material with properties satisfying the prescribed criteria of the invention. The substrate was made using standard techniques. That is the substrate was made with sequentially laminated layers of polyimide, silicone, and Cu respectively formed by lamination of the silicone to the polyimide then lamination of the Cu to the silicone. The lamination process is well documented in the literature (see for example Chapter 4 in *Low Cost Flip Chip Technologies*, John H. Lau, McGraw-Hill, 2000, and pp. 726-804 in *Microelectronic Packaging Handbook*, R. R. Tummala, E. J. Pymaszewsho, and A. G. Klofenstein, Chapman and Hall, 1996). The silicone compliant material was a polymethalsiloxane (PDMS) material sold by and formulated by Dow Corning having a modulus of approximately 200-1000 kPa and elongation to failure of approximately 130-200% with a thickness of 25 µm and identified with Dow Corning photo definable product number WL5350/1. [Alternatively, Dow Corning photo definable product WL5150 has similar properties.] A copper layer of 25-30 µm thickness was laminated to the compliant silicone. The metal layer was patterned using conventional photolithography and etching techniques. After die attachment to the substrate pads via the flux previously described, the entire assembly was reflowed. The reflow process used ramping rates as previously described and a peak temperature of 245 degrees C. plus or minus 5 degrees C. The device was exposed to the peak temperature for 20 to 40 seconds. The commercial underfill material manufactured by Ablestik Corporation was used to reinforce the bump interconnection.

The invention claimed is:

1. An assembly comprising an integrated circuit die having pads and an external body having pads, said die electrically connected to said body by conducting regions between said pads of said die and said pads of said body characterized in that a compliant region underlies at least 75% of a surface area of said pads of said die that are critical pads or at least 75% of a surface area of said pads of said body that are critical pads wherein said compliant region has an average thickness of at least 10 µm, has a modulus less than or equal to 250 MPa, and has an elongation to failure greater than or equal to 75%.

2. The assembly of claim 1 wherein said modulus is less than 200 MPa.

3. The assembly of claim 1 wherein said modulus is less than 100 MPa.

4. The assembly of claim 1 wherein said elongation to failure is greater than 100%.

5. The assembly of claim 4 wherein said elongation to failure is greater than 500%.

6. The assembly of claim 1 wherein at least 85% of said surface area is underlain.

7. The assembly of claim 6 wherein at least 95% of said surface area is underlain.

8. An integrated circuit comprising a die including pads to which external electrical connection is made characterized in that a compliant region underlies at least 75% of a surface area of said pads that are critical pads wherein said compliant region has an average thickness of at least 10 µm, has a modulus less than or equal to 250 MPa, and has an elongation to failure of greater than or equal to 75%.

9. The integrated circuit of claim 8 wherein said modulus is less than 200 MPa.

10. The integrated circuit of claim 9 wherein said modulus is less than 100 MPa.

11. The integrated circuit of claim 8 wherein said elongation to failure is greater than 100%.

12. The integrated circuit of claim 11 wherein said elongated failure is greater than 500%.

13. The integrated circuit of claim 8 wherein at least 85% of said surface area is underlain.

14. The integrated circuit of claim 13 wherein at least 95% of said surface area is underlain.

15. A circuit board including pads suitable for electrical connection to an electronic device characterized in that a compliant region underlies at least 75% of a surface area of said pads that are critical pads wherein said compliant region has an average thickness of at least 10 μm, has a modulus less than or equal to 250 MPa, and has an elongation to failure of greater than or equal to 75%.

16. The circuit board of claim 15 wherein said modulus is less than 200 MPa.

17. The circuit board of claim 16 wherein said modulus is less than 100 MPa.

18. The circuit board of claim 15 wherein said elongation to failure is greater than 100%.

19. The circuit board of claim 18 wherein said elongation to failure is greater than 500%.

20. The circuit board of claim 15 wherein at least 85% of said surface area is underlain.

21. The circuit board of claim 20 wherein at least 95% of said surface area is underlain.

* * * * *